US011060203B2

(12) United States Patent
Lau et al.

(10) Patent No.: US 11,060,203 B2
(45) Date of Patent: Jul. 13, 2021

(54) LINER FOR EPI CHAMBER

(71) Applicant: Applied Materials, Inc., Santa Clara, CA (US)

(72) Inventors: Shu-Kwan Lau, Sunnyvale, CA (US); Mehmet Tugrul Samir, Mountain View, CA (US); Aaron Miller, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 652 days.

(21) Appl. No.: 14/826,065

(22) Filed: Aug. 13, 2015

(65) Prior Publication Data

US 2016/0068997 A1 Mar. 10, 2016

Related U.S. Application Data

(60) Provisional application No. 62/046,377, filed on Sep. 5, 2014.

(51) Int. Cl.
| | | |
|---|---|---|
| *C30B 25/08* | (2006.01) | |
| *C30B 25/14* | (2006.01) | |
| *C23C 16/455* | (2006.01) | |
| *C23C 16/44* | (2006.01) | |
| *C30B 35/00* | (2006.01) | |

(52) U.S. Cl.
CPC .......... *C30B 25/14* (2013.01); *C23C 16/4408* (2013.01); *C23C 16/45574* (2013.01); *C23C 16/45591* (2013.01); *C30B 35/00* (2013.01)

(58) Field of Classification Search
None
See application file for complete search history.

(56) References Cited

U.S. PATENT DOCUMENTS

| | | | |
|---|---|---|---|
| 5,914,050 A | * | 6/1999 | Comita ............... C23C 16/4405 118/715 |
| 6,099,648 A | | 8/2000 | Anderson |
| 6,143,079 A | | 11/2000 | Halpin |
| 6,576,565 B1 | | 6/2003 | Chakravarti et al. |
| 9,768,043 B2 | | 9/2017 | Chang et al. |
| 2002/0185062 A1 | | 12/2002 | Halpin |

(Continued)

FOREIGN PATENT DOCUMENTS

| | | |
|---|---|---|
| CN | 101634014 A | 1/2010 |
| CN | 102549718 A | 7/2012 |

(Continued)

OTHER PUBLICATIONS ntemational Search Report and Written Opinion of related application PCT/US2015/045331.

(Continued)

*Primary Examiner* — Karla A Moore
*Assistant Examiner* — Tiffany Z Nuckols
(74) *Attorney, Agent, or Firm* — Patterson + Sheridan, LLP

(57) ABSTRACT

Embodiments disclosed herein describe a liner assembly including a plurality of individually separated gas passages. The liner assembly provides control of flow parameters, such as velocity, density, direction and spatial location, across a substrate being processed. The processing gas across the substrate being processed may be specially tailored for individual processes with a liner assembly according to the present embodiments.

9 Claims, 5 Drawing Sheets

(56) References Cited

U.S. PATENT DOCUMENTS

| | | |
|---|---|---|
| 2003/0019428 A1 | 1/2003 | Ku et al. |
| 2003/0124820 A1 | 7/2003 | Johnsgard et al. |
| 2006/0291835 A1 | 12/2006 | Nozaki et al. |
| 2007/0068456 A1 | 3/2007 | Grimbergen et al. |
| 2007/0087533 A1* | 4/2007 | Nishikawa .......... C23C 16/4409 438/478 |
| 2007/0227441 A1 | 10/2007 | Narahara et al. |
| 2008/0017116 A1 | 1/2008 | Campbell et al. |
| 2010/0120259 A1* | 5/2010 | Vatus .................. C23C 16/4585 438/758 |
| 2011/0174212 A1* | 7/2011 | Ramachandran ..... C23C 16/455 117/98 |
| 2011/0262870 A1* | 10/2011 | Lee .......................... B08B 15/00 430/325 |
| 2012/0034786 A1 | 2/2012 | Dhindsa et al. |
| 2012/0270384 A1 | 10/2012 | Sanchez et al. |
| 2013/0288460 A1 | 10/2013 | Ranish et al. |
| 2014/0137801 A1* | 5/2014 | Lau ......................... C30B 25/14 118/728 |
| 2014/0199056 A1 | 7/2014 | Chang et al. |
| 2014/0216585 A1 | 8/2014 | Tjandra et al. |
| 2014/0224174 A1* | 8/2014 | Abedijaberi ...... C23C 16/45563 118/715 |

FOREIGN PATENT DOCUMENTS

| | | |
|---|---|---|
| CN | 103415910 A | 11/2013 |
| CN | 103430285 A | 12/2013 |
| JP | 2002-075901 A | 3/2002 |
| KR | 1020130122500 A | 11/2013 |
| TW | 517097 B | 1/2003 |
| TW | 201009137 A | 3/2010 |
| TW | 201126629 A | 8/2011 |
| TW | 201128734 A | 8/2011 |
| TW | 201250052 A | 12/2012 |
| TW | 201419438 A | 5/2014 |
| TW | 201432103 A | 8/2014 |

OTHER PUBLICATIONS

Chinese Office Action dated Oct. 23, 2018 for Application No. 201580047552.0.

Chinese Office Action dated Dec. 29, 2018 for Application No. 201580045428.0.

* cited by examiner

LINER FOR EPI CHAMBER

CROSS-REFERENCE TO RELATED APPLICATIONS

This application claims priority to U.S. Provisional Patent Application Ser. No. 62/046,377, filed Sep. 5, 2015, which is incorporated by reference herein.

BACKGROUND

Field

Embodiments of the present disclosure generally relate to liners for use in semiconductor processing equipment.

Description of the Related Art

Some processes for fabricating semiconductor devices, for example rapid thermal processing, epitaxial deposition, chemical vapor deposition, physical vapor deposition, and electron-beam curing, are performed at elevated temperatures. Usually, substrates being processed are heated to a desired temperature in a processing chamber by one or more heat sources. The one or more heat sources are typically mounted outside the chamber body so that the energy generated by the heat source radiates upon the substrate positioned within the chamber body.

Processing gases are usually supplied to the chamber from a gas inlet, and are kept flowing in the chamber by a pumping system connected to chamber. Gas distribution in a conventional chamber may be non-uniform across the chamber. For example, gas distribution near the gas inlet may be different from gas distribution near the pumping port, and gas distribution near the edge region may be different from gas distribution near the center region. Although, continuous rotation of the substrate may reduce the non-uniformity of gas distribution, the improvement realized by the rotation alone may not be enough as the requirement for uniformity increases.

Therefore, there is a need for a thermal reactor with improved gas flow distribution.

SUMMARY

Embodiments disclosed herein include a liner for use in a semiconductor processing chamber. In one embodiment, a liner assembly can include a cylindrical body having an outer surface and an inner surface, the outer surface having an outer circumference less than a circumference of the semiconductor process chamber, the inner surface forming the walls of a process volume; and a plurality of gas passages formed in connection with the cylindrical body; an exhaust port positioned opposite to the plurality of gas passages; a crossflow port positioned non parallel to the exhaust port; and a thermal sensing port positioned separate from the crossflow port.

In another embodiment, a liner assembly, can include an upper liner comprising a cylindrical upper body having an upper protrusion; and a plurality of upper inlets formed in connection with the cylindrical body; an upper exhaust port positioned about parallel to the plurality of upper inlets; and an upper crossflow port positioned about perpendicular to the exhaust port; and a lower liner comprising a cylindrical lower body having a receiving groove to receive the upper protrusion; and a plurality of lower inlets formed in connection with the cylindrical body, the plurality of lower inlets and the plurality of upper inlets cooperatively defining a plurality of gas passages; a lower exhaust port fluidly connected to the upper exhaust port; a lower crossflow port fluidly connectable to the upper crossflow port; and a thermal sensing port spaced apart from the lower crossflow port.

In another embodiment, a liner assembly can include an upper liner comprising a cylindrical upper body having an upper protrusion; and a plurality of upper inlets formed in connection with the cylindrical body, the midline of the plurality of upper inlets being positioned at about 90 degrees as measured from a bisecting line and in a first plane; an upper exhaust port formed opposite the plurality of upper inlets, the midline of the exhaust port being positioned at about 270 degrees as measured from a bisecting line and in the first plane; and an upper crossflow port positioned at about 0 degrees as measured from a bisecting line and in the first plane; and a lower liner comprising a cylindrical lower body having a receiving groove, the receiving groove to receive the upper protrusion; and a plurality of lower inlets formed in connection with the cylindrical body, the plurality of lower inlets to combine with the plurality of upper inlets to form a plurality of gas passages, the plurality of lower inlets being positioned in a second plane, the second plane being different from the first plane; a lower exhaust port fluidly connected to the upper exhaust port, the lower exhaust port being positioned substantially perpendicular to the plurality of lower inlets; a lower crossflow port fluidly connected to the upper crossflow port, the lower crossflow port being positioned off from parallel to the exhaust port; and a thermal sensing port positioned separately from the lower crossflow port, the plurality of lower inlets combining with the plurality of upper inlets to create a plurality of gas passages, the plurality of gas passages.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments disclosed herein describe a liner for use in semiconductor process systems. The liner incorporates a crossflow design including at least 6 zones to allow for greater flow zonality. Further, a temperature sensing device is used in connection with but separate from the liner, allowing for greater ease of exchanging the liners, a more resilient liner and reduced expense. As well, the positioning of the crossflow port off center (e.g., a position which is not the 0 degree position) from the centerline to allow for increased variability in spacing between the zones of flow. Embodiments of the devices disclosed herein are more clearly described with reference to the figures below.

Figure 1:
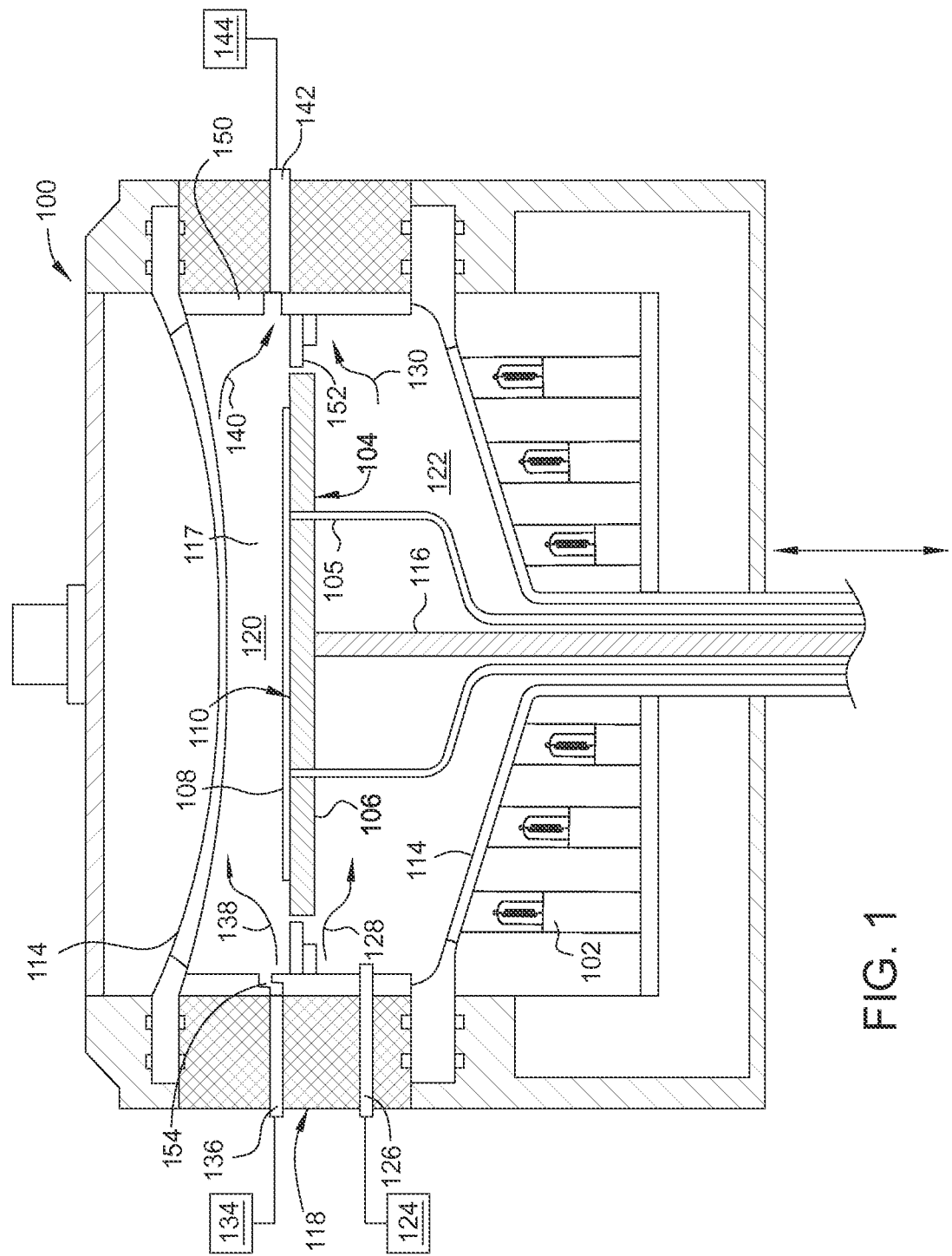
FIG. 1 illustrates a schematic sectional view of a backside heating process chamber having a liner assembly, according to one embodiment.

FIG. 1 illustrates a schematic sectional view of a heating process chamber 100 having a liner assembly 150, according to one embodiment. In one example, this can be a backside heating process chamber. One example of a process chamber that may be adapted to benefit from the embodiments described herein is an Epi process chamber, which is available from Applied Materials, Inc., located in Santa Clara, Calif. It is contemplated that other processing chambers, including those from other manufacturers, may be adapted to practice the present embodiments.

The process chamber 100 may be used to process one or more substrates, including the deposition of a material on an upper surface of a substrate 108. The process chamber 100 can include a process chamber heating device, such as an array of radiant heating lamps 102 for heating, among other components, a back side 104 of a substrate support 106 or the back side of the substrate 108 disposed within the process chamber 100. The substrate support 106 may be a disk-like substrate support 106 as shown, or may be a ring-like substrate support (not shown), which supports the substrate from the edge of the substrate or may be a pin-type support which supports the substrate from the bottom by minimal contact posts or pins.

In this embodiment, the substrate support 106 is depicted as located within the process chamber 100 between an upper dome 114 and a lower dome 112. The upper dome 114 and the lower dome 112, along with a base ring 118 that is disposed between the upper dome 114 and lower dome 112, can define an internal region of the process chamber 100. The substrate 108 (not to scale) can be brought into the process chamber 100 and positioned onto the substrate support 106 through a loading port (not shown), which is obscured by the substrate support 106 in the view of FIG. 1.

The base ring 118 can generally include the loading port, a process gas inlet 136, and a gas outlet 142. The base ring 118 may have a generally oblong shape with the long side on the loading port and the short sides on the process gas inlet 136 and the gas outlet 142, respectively. The base ring 118 may have any desired shape as long as the loading port, the process gas inlet 136 and the gas outlet 142 are angularly offset at about 90 degrees with respect to each other. For example, the loading port may be located at a side between the process gas inlet 136 and the gas outlet 142, with the process gas inlet 136 and the gas outlet 142 disposed at opposing one another on the base ring 118. In various embodiments, the loading port, the process gas inlet 136 and the gas outlet 142 are aligned to each other and disposed at substantially the same level with respect to a basis plane of the chamber 100. Words such as "above", "below", "top", "bottom", "upper", "lower", etc. are not references to absolute directions but are relative to the basis plane of the chamber 100.

The term "opposite", as used herein, is defined in mathematical terms such that A is opposite to B with respect to a reference plane P extending between A and B. Opposite is intended generally and thus does not require that A and B be exactly opposite, unless expressly stated.

The substrate support 106 is shown in an elevated processing position, but may be vertically translated by an actuator (not shown) to a loading position below the processing position to allow lift pins 105 to contact the lower dome 112, extend through holes in the substrate support 106 and along a central shaft 116, and raise the substrate 108 from the substrate support 106. A robot (not shown) may then enter the process chamber 100 to engage and remove the substrate 108 therefrom though the loading port. The substrate support 106 then may be actuated up to the processing position to place the substrate 108, with its device side 117 facing up, on a front side 110 of the substrate support 106.

The substrate support 106, while located in the processing position, divides the internal volume of the process chamber 100 into a processing region 120 that is above the substrate, and a purge gas region 122 below the substrate support 106. The substrate support 106 can be rotated during processing by the central shaft 116 to minimize the effect of thermal and process gas flow spatial anomalies within the process chamber 100 and thus facilitate uniform processing of the substrate 108. The substrate support 106 is supported by the central shaft 116, which moves the substrate 108 in an up and down direction during loading and unloading, and in some instances, during processing of the substrate 108. The substrate support 106 may be formed from silicon carbide or graphite coated with silicon carbide to absorb radiant energy from the lamps 102 and direct the radiant energy to the substrate 108.

In general, the central window portion of the upper dome 114 and the bottom of the lower dome 112 are formed from an optically transparent material such as quartz. The thickness and the degree of curvature of the upper dome 114 may be configured to manipulate the uniformity of the flow field in the process chamber.

The lamps 102 can be disposed adjacent to and beneath the lower dome 112 in a specified manner around the central shaft 116 to independently control the temperature at various regions of the substrate 108 as the process gas passes over, thereby facilitating the deposition of a material onto the upper surface of the substrate 108. The lamps 102 may be used to heat the substrate 108 to a temperature within a range of about 200 degrees Celsius to about 1600 degrees Celsius. While not discussed here in detail, the deposited material may include silicon, doped silicon, germanium, doped germanium, silicon germanium, doped silicon germanium, gallium arsenide, gallium nitride, or aluminum gallium nitride.

Process gas supplied from a process gas supply source 134 is introduced into the processing region 120 through a process gas inlet 136 formed in the sidewall of the base ring 118. The process gas inlet 136 connects to the process gas region through a plurality of gas passages 154 formed through the liner assembly 150. The process gas inlet 136, the liner assembly 150, or combinations thereof, are configured to direct the process gas in a direction which can be generally radially inward. During the film formation process, the substrate support 106 is located in the processing position, which can be adjacent to and at about the same elevation as the process gas inlet 136, allowing the process gas to flow up and round along flow path 138 across the upper surface of the substrate 108. The process gas exits the processing region 120 (along the flow path 140) through a gas outlet 142 located on the opposite side of the process chamber 100 as the process gas inlet 136. Removal of the process gas through the gas outlet 142 may be facilitated by a vacuum pump 144 coupled thereto.

Purge gas supplied from a purge gas source 124 is introduced to the purge gas region 122 through a purge gas inlet 126 formed in the sidewall of the base ring 118. The purge gas inlet 126 connects to the process gas region through the liner assembly 150. The purge gas inlet 126 is disposed at an elevation below the process gas inlet 136. If the circular shield 152 is used, the circular shield 152 may be disposed between the process gas inlet 136 and the purge gas inlet 126. In either case, the purge gas inlet 126 is configured to direct the purge gas in a generally radially inward direction. If desired, the purge gas inlet 126 may be configured to direct the purge gas in an upward direction. During the film formation process, the substrate support 106 is located at a position such that the purge gas flows down and round along flow path 128 across back side 104 of the substrate support 106. Without being bound by any particular theory, the flowing of the purge gas is believed to prevent or substantially avoid the flow of the process gas from entering into the purge gas region 122, or to reduce diffusion of the process gas entering the purge gas region 122 (i.e., the region under the substrate support 106). The purge gas exits the purge gas region 122 (along flow path 130) and is exhausted out of the process chamber through the gas outlet 142 located on the opposite side of the process chamber 100 as the purge gas inlet 126.

The liner assembly 150 may be disposed within or surrounded by an inner circumference of the base ring 118. The liner assembly 150 may be formed from a quartz material and generally shields the walls of the process chamber 100 from conditions in the processing region 120 and purge gas region 122. The walls, which may be metallic, may react with precursors and cause contamination in the processing volume. An opening may be disposed through the liner assembly 150 and aligned with the loading port to allow for passage of the substrate 108. While the liner assembly 150 is shown as a single piece, it is contemplated that the liner assembly 150 may be formed from multiple pieces. The liner assembly 150 shown in FIG. 1 is composed of an upper liner 200 and a lower liner 300, which are described in more detail in FIGS. 2 and 3.

Figure 2A:
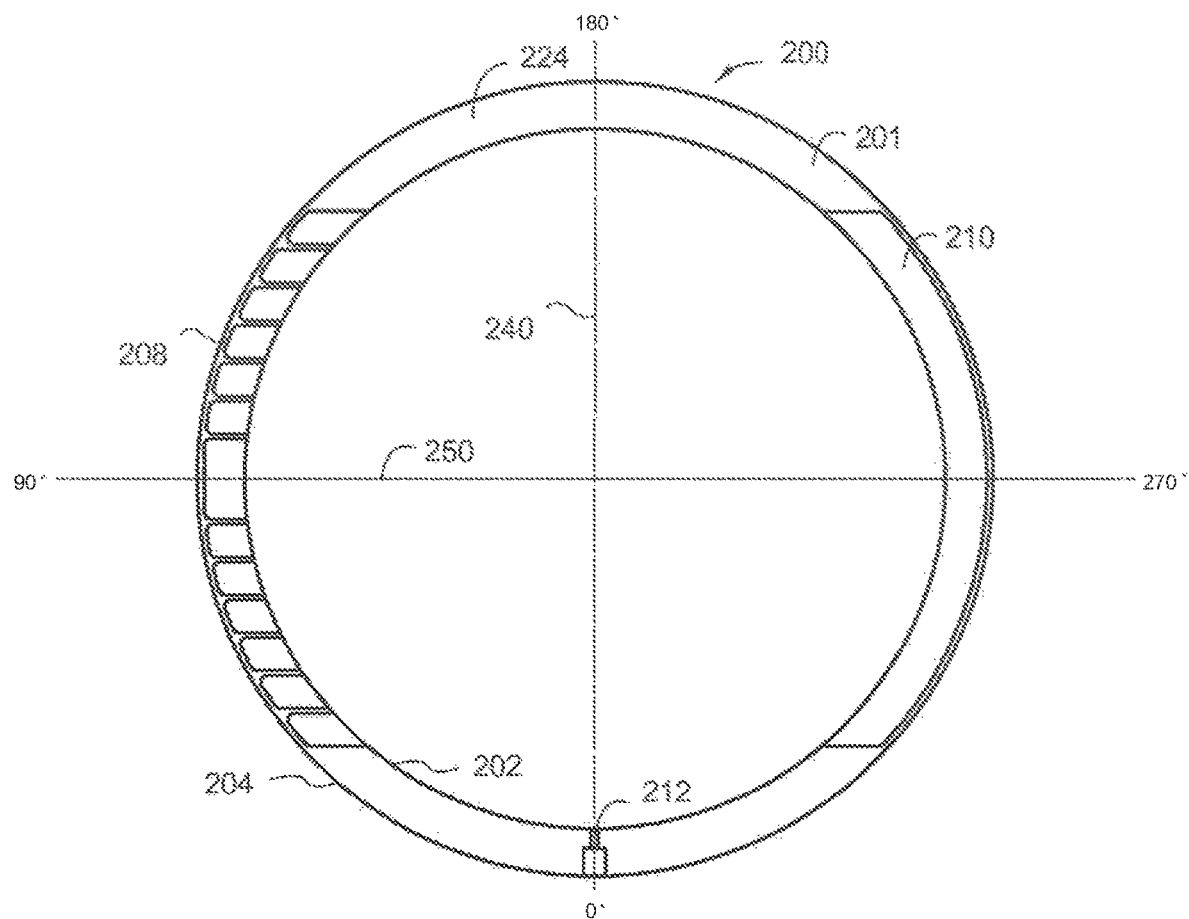
FIG. 2A depicts a top view of an upper liner, according to embodiments described herein.

FIG. 2A depicts a top view of an upper liner 200, according to embodiments described herein. The upper liner 200 includes an upper body 201 having an inner surface 202 and an outer surface 204 opposite the inner surface 202. A plurality of upper inlets 208 are formed through the outer surface 204 of the body 201. An exhaust port 210 is formed opposite the plurality of upper inlets 208. An upper crossflow port 212 is formed between the plurality of upper inlets 208 and the exhaust port 210.

The plurality of upper inlets 208 may be described as recesses or grooves formed in the upper body 201. Shown here, the plurality of upper inlets 208 are substantially rectangular and parallel to one another. The plurality of upper inlets 208 may vary in quantity, size and shape, based on desires of the user, flow dynamics, or other parameters. Shown here, thirteen (13) upper inlets 208 are formed in the upper body 201. The plurality of upper inlets 208 can be configured to create a plurality of flow zones in the processing region 120.

Figure 2B:
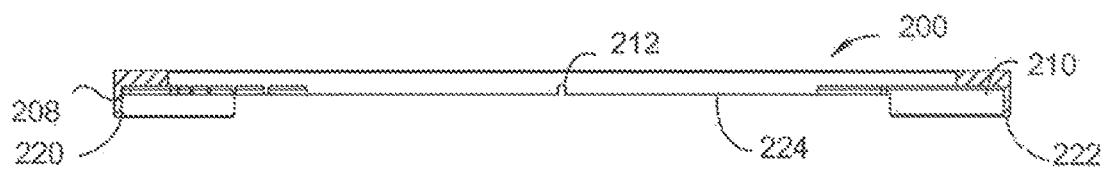
FIG. 2B depicts a side view of the upper liner, according to the embodiments of FIG. 2A.

FIG. 2B depicts a side view of the upper liner 200, according to the embodiments of FIG. 2A. The plurality of upper inlets 208 delivers a gas flow from the process gas supply source 134 to the processing region 120. FIG. 2B further shows a plurality of upper protrusiones, such as an upper inlet protrusion 220 and an exhaust protrusion 222. The upper inlet protrusion 220 and an exhaust protrusion 222 may be accompanied by further protrusions formed at any position of the upper liner. Further, either the upper inlet protrusion 220, the exhaust protrusion 222 or both may be excluded or replaced with upper protrusions at different positions on the upper body 201. The upper inlet protrusion 220 and the exhaust protrusion 222 assist with proper positioning of the upper liner 200 in connection with the lower liner 300, described below.

Figure 3A:
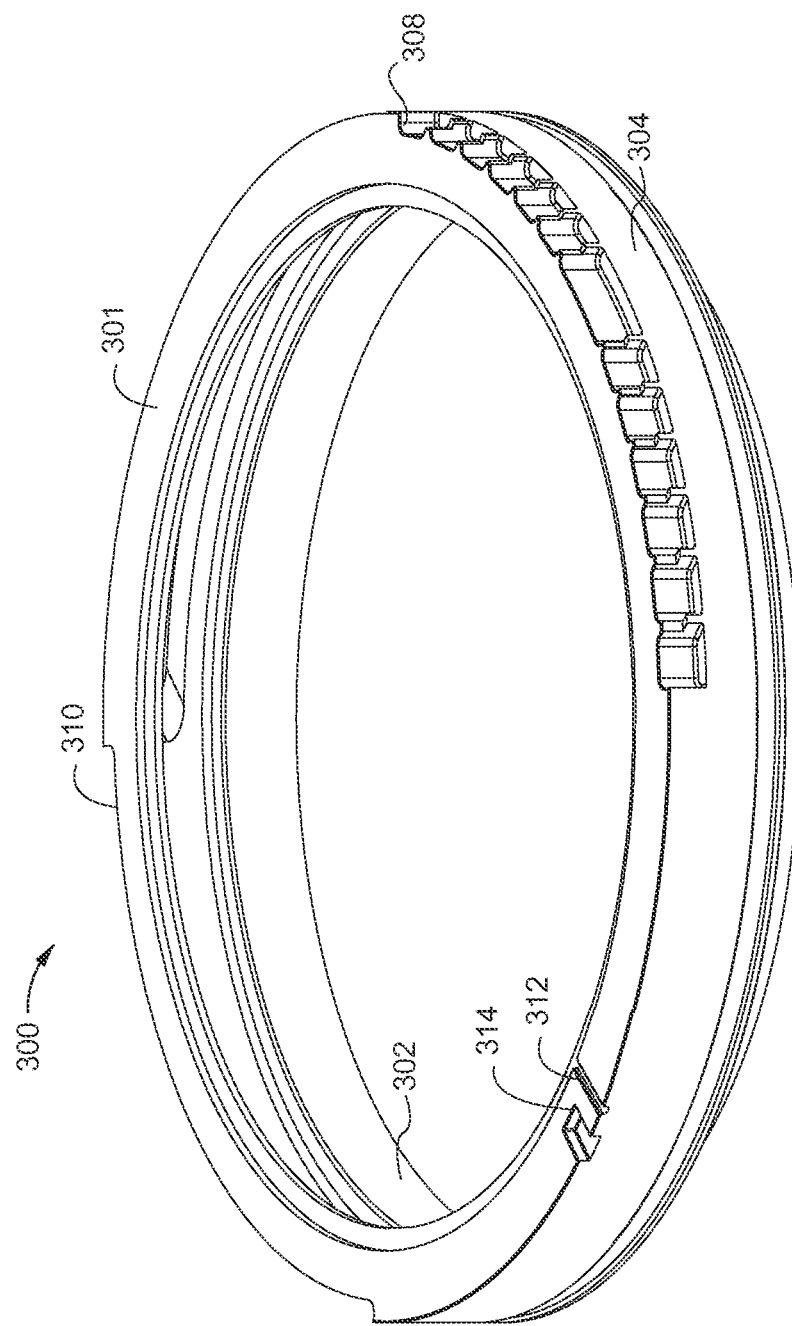
FIGS. 3A and 3B depict top and side views of a lower liner, according to one embodiment.
Figure 3B:
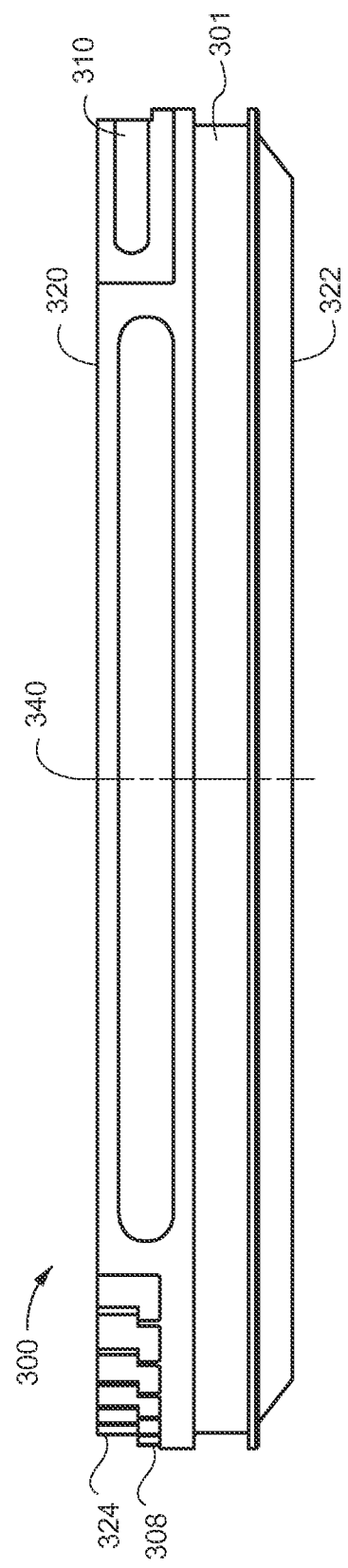

FIGS. 3A and 3B depict a lower liner 300 according to one embodiment. The liner 300 includes a lower body 301 with an inner surface 302 and an outer surface 304. The inner surface 302, in conjunction with the inner surface 202, form the boundaries of the processing region 120 and the purge gas region 122. A plurality of lower inlets 308 are formed through the outer surface 304 of the body 301. Gas supplied from the process gas supply source 134 is introduced into the processing region 120 through the plurality of lower inlets 308.

The plurality of lower inlets 308 are positioned radially through the exterior of the lower body 301. The plurality of lower inlets 308 can deliver one or more individual gas flows. Shown here, thirteen (13) lower inlets 308 are formed in the lower body 301. However, more or fewer inlets may be used in one or more embodiments. The lower inlets may be positioned and oriented to create multiple flow zones. The flow zones are regions of differing gas flow as delivered through the lower inlets 308 and the upper inlets 208. By creating more zones, the gas delivery over the substrate is more tunable than with fewer flow zones.

The plurality of lower inlets 308 may be configured to provide individual gas flows with varied parameters, such as velocity, density, or composition. The plurality of lower inlets 308 are configured to direct the process gas in a generally radially inward direction, with the gas being delivered to a central area of the process region 306. Each of the plurality of lower inlets 308 may be used to adjust one or more parameters, such as velocity, density, direction and location, of the gas from the process gas supply source 134. The plurality of lower inlets 308 are positioned across from an exhaust port 310 and at least 25 degrees apart from a crossflow port 312. In one embodiment, the crossflow port is position at the 0 degree position as measured from a bisecting line 240. The plurality of lower inlets 308 can be positioned at 90 degrees as measured between a midline 250 and the bisecting line 240. The exhaust port 310 can be positioned at 270 degrees as measured between the midline 250 and the bisecting line 240.

Shown in FIG. 3B is the lower connecting surface 320 of the lower liner 300. The lower connecting surface 320 provides a receiving surface for the upper connecting surface 224. As such, the lower connecting surface 320 may have grooves, flat regions or other areas such that the lower connecting surface 320 can properly mate with the upper connecting surface 224. Shown here, an inlet groove 324 is formed through the lower connecting surface 320 at the plurality of lower inlets.

The lower liner 300 and the upper liner 200 are combined to create the liner assembly 150. In one embodiment, an upper connecting surface 224 is placed in connection with the lower connecting surface 320. The upper connecting surface 224 forms a seal with at least a portion of the lower connecting surface 320. When the upper connecting surface 224 is placed in connection with lower connecting surface 320, the plurality of lower inlets 308 extend upward to deliver the gas flow through the plurality of upper inlets 208 of the upper liner 200. Thus the gas flow is redirected to the processing region 120. Though shown with an equal number of lower inlets 308 and upper inlets 208, the number and positioning of the lower inlets 308 may differ from shown or comparatively to the upper inlets 208.

The upper crossflow port 212 combines with the lower crossflow port 312 to create a crossflow port. The crossflow port can deliver a gas flow which is substantially perpendicular to the flow of gas from the plurality of gas passages 154. The position of the crossflow port may be coplanar with the plurality of upper inlets 208, the upper crossflow port 212, the lower crossflow port 312, the upper exhaust port 210, the lower crossflow port 312 or combinations thereof. The orientation of the crossflow port may be substantially perpendicular to and intersecting with the flow from the plurality of gas passages 154 (e.g., perpendicular in the x and y plane and intersecting in the z plane). In another embodiment, the crossflow port is oriented to deliver a gas out of plane from the gas flow from the plurality of gas passages 154 (e.g., perpendicular in the x and y plane and not intersecting in the z plane).

A thermal sensing port 314 can be positioned in the lower body 301. The thermal sensing port 314 can house a thermal sensing device for the process chamber 100, such as a thermocouple. The thermal sensing port 314 allows for temperature measurement during processing such that temperature of the substrate, and deposition from the process gases, can be fine-tuned. The thermal sensing port 314 can be positioned near the lower crossflow port 312. In one embodiment, the thermal sensing port 314 is positioned at the 5 degree position as measured from a bisecting line 340, shown in FIG. 3B, at the outer circumference. It is believed that the combination of the thermal sensing port 314 and the crossflow port 312 can create abnormal wear. By separating the thermal sensing port 314 from the crossflow port 312, abnormal wear related to the combination may be avoided.

During processing, the substrate support 104 may be located in the processing position, which is adjacent to and at about the same elevation as the plurality of gas passages, allowing the gas to flow up and round along flow path across the upper surface of the substrate support. The crossflow port 312 delivers a second gas flow across the flow of the plurality of gas passages such that the second gas flow intersects with at least one of the flow regions created by the plurality of gas passages. The process gas exits the process region 306 through the exhaust port 310 formed through the body 301. Removal of the process gas through the exhaust port 310 may be facilitated by a vacuum pump (not shown) coupled thereto. As the plurality of gas passages and the exhaust port 310 are aligned to each other and disposed approximately at the same elevation, it is believed that such a parallel arrangement, will enable a generally planar, uniform gas flow across the substrate. Further, radial uniformity may be provided by the rotation of the substrate through the substrate support.

Figure 4:
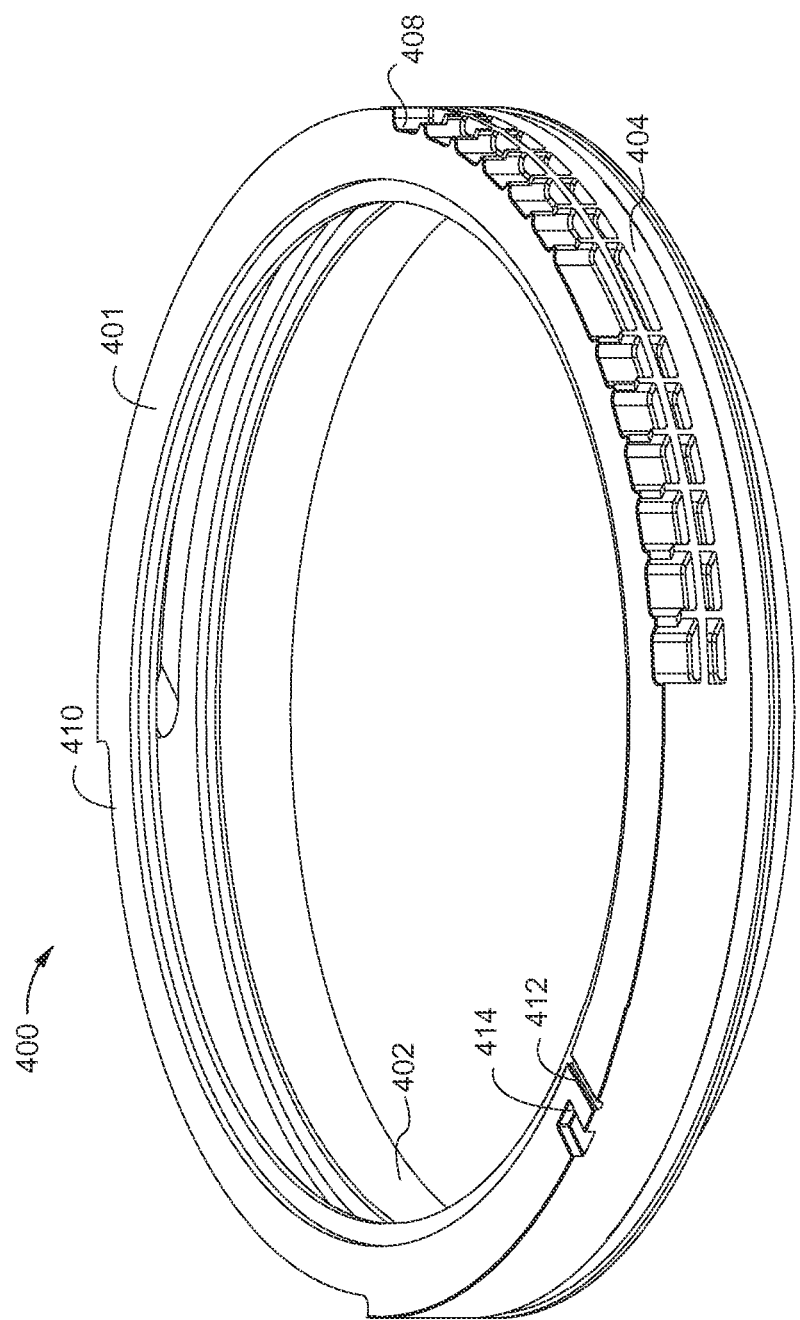
FIG. 4 depicts a top view of a lower liner, according to another embodiment.

FIG. 4 depicts a lower liner 400 according to another embodiment. The liner 400 includes a lower body 401 with an inner surface 402 and an outer surface 404. As above, the inner surface 402, in conjunction with the inner surface 202, form the boundaries of the processing region 120 and the purge gas region 122. A plurality of lower inlets 408 are formed through the outer surface 404 of the body 401.

In this embodiment, the plurality of lower inlets 408 has two separate rows. Two separate gas flows, as delivered through the plurality of lower inlets 408, allow two separate gas flows to be combined prior to delivery to the processing region 120. In this embodiment, the first row and the second row feed into the same channel created in combination with the upper liner. By combining two gas flows through gas passages 154 of the liner assembly 150, the temperature of the gases can be modulated prior to delivery to the process chamber, complex chemistries can be activated and delivered without negatively affecting the substrate and changes in flow dynamics in the process chamber can be avoided.

The liner assembly described herein allows for finer control of deposition uniformity for both current substrate sizes, such as a 300 mm diameter, and larger, such as 450 mm diameter. The flow zones allow for finer control of deposition in specific regions of the substrate.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:

1. A liner assembly, comprising:
an upper liner comprising:
a cylindrical upper body having:
an outer surface, an inner surface and a connector surface connecting the outer surface to the inner surface;
a plurality of upper inlets formed in the cylindrical upper body;
an upper exhaust port positioned opposite to the plurality of upper inlets; and
an upper crossflow recess formed in the connector surface, the upper crossflow recess extending from the outer surface to the inner surface and positioned non parallel to the exhaust port and at least 25 degrees angularly offset from the exhaust port; and
a lower liner comprising:
a cylindrical lower body having:
a plurality of lower inlets formed in the cylindrical lower body, the plurality of lower inlets and the plurality of upper inlets cooperatively defining a plurality of gas passages when the lower liner engages the upper liner;
a lower exhaust port fluidly connected to the upper exhaust port when the lower liner engages the upper liner;
a lower crossflow recess fluidly connected to the upper crossflow recess when the lower liner engages the upper liner, the lower crossflow recess formed in an upper surface of the cylindrical lower body and extending from a radially outward surface of the cylindrical body to a radially inner surface of the cylindrical body; and
a thermal sensing port separate from the crossflow recess and angularly offset from the crossflow recess with respect to a central axis orthogonal to a plane cylindrical lower body, the thermal sensor port formed in the upper surface of the cylindrical lower body and extending inward from the radially outer surface of the cylindrical body.

2. The liner assembly of claim 1, wherein the thermal sensing port, the lower crossflow recess, the lower exhaust port and the plurality of gas passages are in a shared plane.

3. The liner assembly of claim 2, wherein the lower crossflow recess has an orientation to direct gas flow outside of the shared plane.

4. The liner assembly of claim 1, wherein the plurality of upper inlets have an entrance formed through the outer surface and an exit formed through the inner surface, wherein the entrances and exits are not coplanar with one another.

5. The liner assembly of 4, wherein at least one of the entrances is fluidly connected with more than one of the exits.

6. The liner assembly of claim 4, wherein at least one of the exits is fluidly connected with more than one of the entrances.

7. The liner assembly of claim 1, wherein the crossflow recess is positioned at about a 0 degree position and a midpoint of the plurality of lower inlets is positioned at a 90 degree position, the positions being measured from a bisecting line of the lower crossflow recess.

8. The liner assembly of claim 7, wherein the thermal sensing port is positioned at about a 5 degree position, the position being measured from the bisecting line.

9. The liner assembly of claim 1, wherein the plurality of lower inlets create a plurality of flow zones, the flow zones being parallel to one another and perpendicular to a bisecting line from the lower crossflow recess.

\* \* \* \* \*